United States Patent [19]

Wu

[11] Patent Number: 4,675,235
[45] Date of Patent: Jun. 23, 1987

[54] LAMINATED SYNTHETIC MICA ARTICLES

[75] Inventor: Shy-Hsien Wu, Horseheads, N.Y.

[73] Assignee: Corning Glass Works, Corning, N.Y.

[21] Appl. No.: 817,470

[22] Filed: Jan. 9, 1986

[51] Int. Cl.[4] .................................................. B32B 5/16
[52] U.S. Cl. .................................... 428/363; 428/324;
428/454; 428/464; 428/413
[58] Field of Search .............. 428/464, 324, 454, 413,
428/363

[56] References Cited

U.S. PATENT DOCUMENTS

| | | | |
|---|---|---|---|
| 3,026,222 | 3/1962 | Rogers et al. | 428/344 |
| 4,456,651 | 6/1984 | Pollmeier et al. | 428/363 |
| 4,456,712 | 6/1984 | Christie et al. | 428/901 |
| 4,559,264 | 12/1985 | Hoda et al. | 428/324 |

Primary Examiner—Edith Buffalow
Attorney, Agent, or Firm—C. S. Janes, Jr.

[57] ABSTRACT

Laminated synthetic mica articles are disclosed that have particular applicability as substrates in electronic components. The articles comprise a core of stacked and consolidated, synthetic mica sheets that are impregnated with resin, and a copper foil sealed to a face on the article. Adherence of the copper foil is enhanced by use of a micaceous facing layer and bonding sheet, both being resin-impregnated and the resin cure being advanced beyond the normal B-stage level before assembly. Insulation resistance is enhanced by providing an advanced resin coating on the copper foil before assembly. Use of a bismaleimide triazine and epoxy mixed resin is also disclosed whereby a transformation temperature (Tg) of about 200° C. is obtained.

15 Claims, 1 Drawing Figure

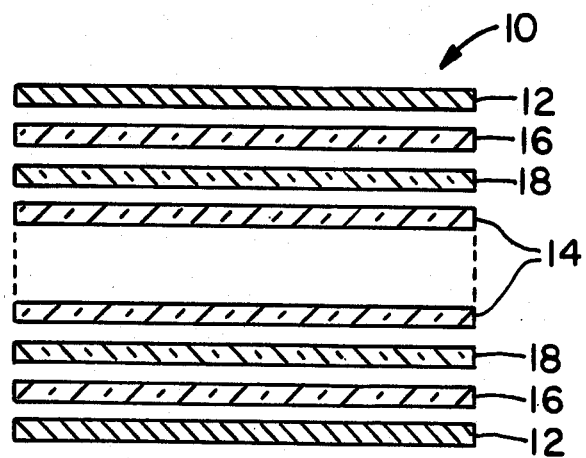

LAMINATED SYNTHETIC MICA ARTICLES

BACKGROUND

This invention relates to a laminated article comprising a core portion formed from sheets of mica paper. The sheets are composed primarily of synthetic mica platelets, and are impregnated with an organic resin. A plurality of such impregnated paper sheets are stacked, and the stack consolidated by pressing, to form the core.

Synthetic mica materials, the processing of such materials to form gels, and the use of such gels to produce films, papers, boards, and the like, are disclosed in U.S. Pat. No. 4,239,519 (Beall et al.)

U.S. Pat. No. 4,559,264 (Hoda et al.) discloses a substrate in which a plurality of synthetic mica papers are laminated together. Each paper is composed of overlapping, ion-exchanged platelets of a synthetic, lithium and/or sodium, water-swelling mica, and is impregnated with an organic resin. A laminated stack of such papers has a planar, isotropic coefficient of thermal expansion in the x-y plane which may be less than $100 \times 10^{-7}/°C$. over a range of 25°–300° C.

When the substrate is used in forming an electronic component, it may be provided with conductive connections by subtractive or additive circuitry processes. For this purpose, a conductive metal foil, usually copper, is attached over a face on the core. It is a prime requisite that such copper foil strongly adhere to the core. This property, known as copper peel strength, is measured in lbs/inch, and is the force required to separate the copper foil from the core face.

Another property of considerable interest is insulation resistance. This is measured in ohms and is the resistance of the core surface to passage of electric current. Moisture pickup is also a concern. While many tests are available, one commonly used is the weight gain in percent of a body after two hours immersion in boiling water. Dieletric constant and loss tangent are also commonly specified properties.

A very low copper peel strength was observed when a copper foil was assembled directly against the face of a synthetic mica sheet stack and the assembly consolidated. To correct this situation, a glass fiber mat or fabric was interposed between the metal and the stack to act as a facing. This does tend to improve peel strength but, obviously, introduces an added step and a non-micaceous material. Both of these would desirably be avoided.

There is a constant desire to increase the potential or maximum operating temperature of a component. Accordingly, a transition temperature (Tg) as high as 200° C. may be specified for a core. Such temperatures were very difficult to attain with previously used epoxy resins.

PURPOSES

It is a basic purpose then to provide an assembly adapted to electronic component production and use, and including a laminated core composed of a stack of resin-impregnated, ion-exchanged, synthetic, sodium and/or lithium mica sheets.

A specific purpose is to provide such an assembly wherein a copper foil is attached to a face on such a core and demonstrates a copper peel strength of at least 7 lbs/inch.

Another purpose is to dispense with the need for glass fabric facings between the core and the copper foil in a laminated component.

Another specific purpose is to provide a laminated board composed of resin-impregnated, synthetic mica sheets and having a transition temperature of at least 200° C.

A further purpose is to provide the transition temperature of at least 200° C. while maintaining other requisites such as flame resistance.

Another specific purpose is to insure an insulation resistance of at least $10^8$ ohms in a laminated board composed of resin-impregnated, synthetic mica sheets.

SUMMARY OF THE INVENTION

My invention contemplates a laminated article comprising a core, at least one copper foil covering a face on the core and a facing layer interposed between the copper foil and the core, the core being formed from a plurality of stacked mica paper sheets, each sheet being composed of overlapping synthetic mica platelets and being impregnated with an organic resin, and the facing layer being composed of a synthetic mica paper impregnated with resin, containing at least 50% chopped glass fibers and cured to a degree greater than ordinary B-staging but less than a complete cure.

In one preferred embodiment, a bonding layer, composed of a resin-impregnated sheet of synthetic mica paper wherein the resin is advanced beyond normal B-staging, is assembled between the core and the facing. In another, the impregnating resin is a mixture where 50–70% of the solids content is a bismaleimide triazine resin and 30–50% is one or more brominated epoxies.

The invention also comprehends a laminated article comprising a core, at least one copper foil covering a face on the core, the core being formed from a plurality of stacked mica paper sheets, each sheet being composed of overlapping synthetic mica platelets, and being impregnated with an organic resin, and the copper foil having its inside surface coated with a thin, relatively advanced resin layer.

The invention further contemplates a method of improving the copper peel strength between a laminated core and a copper foil attached to a face on the core, the core being formed from sheets of mica paper, the mica sheets being composed of overlapping synthetic mica platelets impregnated with an organic resin, the method comprising forming a facing layer composed of a synthetic mica paper containing at least 50% chopped glass fibers and impregnated with resin, heating this facing layer at a temperature and for a time to advance the resin cure beyond the normal B-stage but short of a full cure, assembling the laminated core and the copper foil with the facing layer interposed between the foil and a face on the core, and applying heat and pressure to the assembly to effect consolidation.

GENERAL DESCRIPTION

The present invention is concerned with an article comprising a core member, such as a laminated board or substrate, composed of sheets of mica paper impregnated with an organic resin. The makeup and manner of forming such laminated bodies are disclosed in detail in the Hoda et al. and Beall et al. U.S. patents mentioned earlier. The entire disclosures of those patents are incorporated herein by reference to avoid duplication.

Briefly, a selected mica is gelled, flocculated, washed and formed as thin sheets in conventional paper-making manner. The sheets are dried and impregnated with a resin material which is then cured. The impregnated papers are stacked and cut to form prepregs. These may be placed in a die and hot pressed at elevated pressures to form a consolidated body.

Reference is made to the Hoda et al. patent for resin impregnating procedure. In general, a solution of resin in a solvent, such as acetone, is employed. The dried synthetic mica sheets are immersed in the solution and soaked for a time that may be up to an hour. The sheets are then removed, B-staged and laminated by pressing at a somewhat raised temperature.

It is customary to cure the resin in the impregnated paper in two stages. In the first stage, referred to as B-stage, the resin is cured sufficiently to be stiff at ambient. However, it is still capable of flow under elevated temperature and pressure. In the final stage, C-stage, the resin becomes essentially rigid and resistant to flow.

It is also common practice to adhere a thin foil of copper over the surface or face of the laminate to permit subsequent production of circuitry by either additive or subtractive processes. A tendency for the copper foil to peel away from the surface has created an adherence problem. This problem is a basic concern of the present invention.

The copper peel tendency may be substantially corrected by insertion of a glass cloth facing between the copper and the laminate. However, this tends to introduce variable directional expansion coefficients, a condition wherein the expansion coefficients in the x-y axial planes are substantially different. This has an adverse effect on dimensional stability, and hence is undesirable.

I have now found that the adherence of copper foil to a face on a laminated, synthetic mica core can be substantially enhanced by assembling a micaceous facing layer between the core and the copper foil before laminating. The facing layer is composed of synthetic mica paper containing at least 50% by weight chopped glass fibers and impregnated with organic resin. A key feature is curing of the resin to a relatively advanced stage prior to assembly of the article elements for lamination. "Relatively advanced resin" means the resin is cured to a degree greater than that obtained by the normal B-stage, but still short of the C-stage where it becomes rigid and non-flowing. Thus, it is cured to a point intermediate the normal B- and C-stages.

The degree of cure is dependent on both time and temperature as well as on catalyst level. The normal B-stage schedule depends on the resin employed. A typical schedule is 4 minutes at 150° C. In accordance with the present invention, the B-stage, partial cure may be advanced by increasing either time, temperature, or both. Thus, the time may be held constant at 4 minutes while temperature may range up to 200° C. with a bismaleimide-triazine resin. In contrast, the temperature may be held at 150° C. while the time is extended, e.g. to 8 minutes or longer.

Optimum conditions will vary with the resins employed, and the usual experimentation will be necessary to determine them. In general, the time-temperature cycle of the advanced B-staging must provide a substantially improved copper peel strength.

For optimum resistance to copper peeling, a further bonding layer may be interposed between the facing and the papers making up the core. It was found that separation could occur at the interface between the facing layer and the paper core rather than the interface between the copper and the facing layer. This is corrected by the bonding layer which is a sheet of impregnated mica paper wherein the resin has been advanced by a heat treatment beyond B-staging as described for the facing layer.

Recently, a new organic resin family, known as bismaleimide triazine resins, has become available. This family has the advantage that it provides service temperatures on the order of 200° C. Also, the resins have a low dielectric constant of about 3, and a z-direction coefficient of thermal expansion not over about $50 \times 10^{-6}/°C.$ up to 200° C.

The bismaleimide triazine resins, hereafter termed "BT resins", are described in considerable detail in U.S. Pat. No. 4,456,712 and in the technical bulletins of Mitsubishi Gas Chemical Company cited therein, the Mitsubishi Company being the source of the resin. Reference is made to this literature to avoid duplication.

It was readily apparent that the higher temperature capabilities of the new BT resins would, as disclosed in the patent, render them highly desirable in component production, providing other requirements could be satisfied. One particularly important property was flame resistance. This had previously been obtained by using brominated epoxy resins. However, these resins generally provided markedly lower temperature capabilities.

If have now found that the high temperature characteristics of the BT resins in micaceous materials can be retained while providing flame resistance. This combination of properties is achieved with a mixed resin containing in weight percent on a solids basis, 50–70% BT resin and 30–50% of one or more brominated epoxy resins, the total bromine content being at least 12% by weight. One particularly effective mixture for my purposes employs, on a solids basis in weight percent, about 60% of a BT resin designated as BT 2170, about 22% of a brominated epoxy resin having a 20% bromine content, and about 18% of a second brominated epoxy resin having a bromine content of 48%. This mixture can be combined in an acetone solvent.

I have further found that, where a relatively low insulation resistance occurs, this can be substantially improved by pretreatment of the copper foil before assembling it for consolidation. Specifically, I have found that an acceptable level of resistance can be provided by applying a resin varnish to the interior, or core-contacting, surface of the foil, and advancing such resin by a modified B-staging treatment as described for the facing layer.

DESCRIPTION OF THE DRAWING

The attached drawing is an exploded side view, in somewhat distorted dimensions, depicting the elements of a component assembled for lamination.

In the drawing, numeral 10 generally designates the component assembly. The assembly includes copper foils 12 shown as applied over both an upper and lower face. Impregnated mica papers 14 will constitute the core after lamination. In accordance with the present invention, facing layers 16 are interposed between the copper foils 12 and the papers 14. In a preferred form, a bonding sheet 18 may be placed between each facing layer 16 and the papers 14.

SPECIFIC DESCRIPTION

The invention is further described with reference to specific examples, including comparisons. In these examples, pre-pregs of synthetic mica papers impregnated with resin were employed.

The mica papers were prepared from synthetic mica glass-ceramics having the following compositions:

|  | A | B |
| --- | --- | --- |
| $SiO_2$ | 57.5 | 59.5 |
| MgO | 25.0 | 23.4 |
| $Na_2O$ | 6.8 | — |
| $Li_2O$ | — | 6.1 |
| F | 10.7 | 10.9 |

The papers were impregnated with a mixed resin. The mixture was composed of 60% by weight of a bismaleimide-triazine resin available from Mitsubishi International Corp. under the designation BT2170, 22% of a 20% brominated epoxy resin available from Shell under the designation EPON 1123-A-80 and 18% of a 48% brominated resin available from Dow Chemical Co. under the designation DER-542. This mixed resin was cured with 0.1 phr dicumyl peroxide and 0.02 phr zinc octoate.

The mica papers were prepared and impregnated in accordance with procedures described in the Beall et al. and Hoda et al. patents mentioned earlier.

EXAMPLE 1

Synthetic mica papers prepared from a glass-ceramic of composition A, and having a 20% content of chopped glass fibers, were employed to produce a stacked paper core. A facing was prepared based on the B composition mica and containing 70% chopped glass fibers. This was assembled intermediate the core papers and the copper foil.

The resin used for impregnation was the 60/22/18 mixed resin described earlier. All of the papers were subjected to a pretreatment with guanidinium hydrochloride prior to use. The copper sheets applied over the facings were varnished with resin as described in later examples.

The facings on top and bottom of the stack were given an advanced B-staging at 150° C. by heating the top facing for 16 minutes and the bottom for 8 minutes. After 428 hours service the Insulation Resistance was measured in ohms as Top: $1 \times 10^8$; $1.7 \times 10^9$ (2 samples). Bottom $1.5 \times 10^8$; $2.2 \times 10^8$.

These samples equalled or exceeded the standard requirement of $10^8$ ohms. Copper peel strength was about one lb/inch. It was observed, however, that separation occurred between the facing and the core, rather than between the facing and the copper. This indicated a potentially higher copper peel strength was available, and that the problem had shifted to one of compatibility between the facing layer and the core sheets. This was resolved by development of a bonding sheet as described in the examples that follow.

EXAMPLES 2-6

In the following examples, the laminated core was produced from synthetic mice papers of A composition which were pretreated by soaking in guanidinium hydrochloride. Each test piece, but the control, had a facing layer of a synthetic mica paper containing 70% chopped glass fibers, the mica having a composition shown above as B. The paper was impregnated with resin and partially cured. In each case, a bonding sheet was assembled intermediate the facing and the core. This bonding sheet was resin impregnated and partially cured also. The partial curing (B-staging) schedules were all at 150° C., but time was varied to provide different degrees of resin advancement.

TABLE I shows, for each example, the mica composition used in producing the bonding sheet, and the time of partial curing at 150° C. for the bonding and for the facing layer. In examples 2, 3 and 4, both the facing layer and the bonding sheet were pretreated, before impregnation, by soaking in a solution of guanidinium hydrochloride. In example 6, each was similarly pretreated in a solution of octylamine hydrochloride.

The letters "a" and "b" refer to foils attached to opposite surfaces, and the facing layers and bonding sheets associated therewith.

TABLE I

| Example | Bonding sheet Comp. | Bonding sheet B-time (min) | Facing Layer B-time (min.) |
| --- | --- | --- | --- |
| 2a | A | 4 | 4 |
| 2b | A | 4 | 8 |
| 3a | A | 8 | 8 |
| 3b | A | 8 | 12 |
| 4a | B | 8 | 8 |
| 4b | B | 8 | 16 |
| 5 | control (no bonding sheet or facing) | | |
| 6a | A | 8 | 12 |
| 6b | A | 8 | 12 |

Measurements made on the sample test pieces of TABLE I are shown in TABLE II wherein
RC=Resin Content of the bonding sheet.
IR=Insulation Resistance in ohms after 300 hours
Peel=Copper peel in Lb/ /in
BWA=Boiling Water Absorption (100° C./2 hrs)

TABLE II

| Sample | RC (%) | Peel | IR | BWA % |
| --- | --- | --- | --- | --- |
| 2a | 48.2 | 0.5 | $3 \times 10^8$ | .41 |
| 2b |  | 0.5 | $4 \times 10^8$ |  |
| 3a | 52.4 | 7.4 | $7 \times 10^8$ | .56 |
| 3b |  | 7.4 | $7 \times 10^9$ |  |
| 4a | 52 | 8.0 | $5 \times 10^8$ | .69 |
| 4b |  | 7.8 | $8 \times 10^8$ |  |
| 5a | — | 0.4 | $1 \times 10^9$ | .40 |
| 5b |  | 0.5 | $9 \times 10^8$ |  |
| 6a | 67.9 | 7.6 | $4 \times 10^{11}$ | .27 |
| 6b |  | 7.0 | $6 \times 10^{11}$ |  |

Example 2 failed to show any improvement in copper peel strength due to using the normal B-staging schedule of 4 minutes at 150° C. for the bonding sheet. However, when the partial cure was advanced to eight (8) minutes in example 3, the strength increased dramatically to over 7 lbs/inch. Example 4 confirmed the improvement was not mica composition dependent. However, certain other properties were not as good. Example 5, a control sample with no bonding sheet or facing layer, confirms the normal poor copper peel strength. Example 6 shows the optimum results attained when the present invention is combined with a pretreatment with an octylamine solution.

The mixed resin used in these examples provided essentially the characteristics of the BT resins, that is a glass transition temperature of about 200° C., a dielectric constant not over 4.0 and a Z-expansion not over 50 ppm/°C.

In order to determine the general applicability of the foregoing findings, the tests were essentially duplicated using the DER-566 epoxy resin alone for impregnation purposes. The tests reported above were run and showed copper peel values in excess of 7 lbs./in. and IR values of over $10^{10}$ ohms after 300 hours. These results were obtained with the octylamine treated synthetic micas, Advanced B-staging for a bonding sheet containing the composition B mica and 70% chopped fibers was 160°–200° C. for four minutes. That for a composition A bonding sheet containing 20% chopped glass fibers was 170°–200° C. for four minutes. The facing layer, composed of composition B mica with 70% chopped glass fibers, was advance B-staged at 220° C. for four minutes.

The following examples illustrate the effect on insulation resistance (IR) values that the attainable under circumstances where otherwise low values are encountered.

A series of one oz. copper foils was prepared for sealing by brushing over the underside of each foil, a 50% varnish of the mixed resin using the same catalyst level as above. After B-staging under varying conditions, the copper foils were assembled with laminated pre-pregs for hot pressing. The resin pick-up was in the range of 9–11% and thickness about 1.1 mils.

The following examples illustrate application of the inventive method under varying conditions and the comparative results achieved.

EXAMPLE 7

A pre-preg prepared with the mica of composition A was treated with a solution of guanidine to open the surface pores. A varnished copper foil was B-staged for 12 minutes at 150° C. and then assembled over one face of the stacked prepreg while the opposite face was assembled with an unvarnished foil. The assembly was then hot pressed at 180° C. for a period of 120 minutes at 1000 psi pressure. This was followed with a post-cure of four hours at 200° C. under the same pressure. The resulting circuit board blank was operated for 112 hours and insulation resistance measured at that time. The resistance of the varnished face was about $10^6$ ohms whereas the resistance of the unvarnished face was $10^5$ ohms. This indicated B-staging at 150° C. for 12 minutes was insufficient to substantially alter insulation resistance in this example.

EXAMPLE 8

The procedure of Example 7 was repeated, except that the varnished copper foil was advance B-staged for 15.5 minutes. Insulation resistance of $6 \times 10^8$ ohms was measured after 306 hours and one of $3 \times 10^8$ ohms was measured after 596 hours. For comparison, the unvarnished surface measured $2.7 \times 10^5$ after 306 hours. These data indicate that a partial cure of 15 minutes duration at 150° C. is sufficient to improve insulation resistance substantially.

EXAMPLE 9

The procedure of Example 8 was repeated on four separate pre-pregs. In each case, the procedure was varied in two respects. The surface of the mica paper was pretreated with diammonium hexane, rather than guanidine. Also, the varnished copper was advance B-staged for 15 minutes at 150° C. Insulation resistances measured on the varnished surface varied from $8 \times 10^9$ to $2 \times 10^{10}$ ohms, while that of the unvarnished surface varied from 5.6 to $7 \times 10^6$ ohms.

EXAMPLE 10

The procedure of Example 7 was repeated except that the mica of composition B was used in preparing the laminate. Both copper foils were varnished and partially cured at 150° C., one for 16 minutes; the other for 14 minutes. After 306 hours use, the foil staged for 16 minutes had an IR of $3 \times 10^7$ ohms while the 14 minute one was $2 \times 10^7$ ohms. For reference, an unvarnished comparison sample showed $2.5 \times 10^5$ ohms after 112 hours.

EXAMPLE 11

Example 10 was repeated except that the mica paper was pre-treated with diammonium hexane before application of the varnished and advance B-staged copper foils. Both the top foil (16 minutes) and the bottom foil (14 minutes) showed $1-2 \times 10^8$ ohms IR on duplicate samples measured after 596 hours. A comparison unvarnished sample showed $1 \times 10^6$ ohms after 112 hours.

The data obtained in examples 9–11 indicate the efficacy of advanced B-staging in improving insulation resistance where conditions of treatment and materials are varied.

EXAMPLE 12

The prior examples 7–11 were made without a facing inserted between the copper foil and the laminate. Customarily such a facing, e.g., a layer of glass fiber fabric, is provided. Accordingly, a test piece was prepared with a core in accordance with Example 7, and a varnished foil on top and bottom. The top foil was partially cured at 150° C. for 15.5 minutes, and the bottom foil 10 minutes. A compatible facing layer containing 70% chopped glass fibers was assembled between the foils and the pre-preg. After 306 hours, the IR of the top foil (15.5 minutes) was about $1 \times 10^9$ ohms, while the bottom (10 minutes) was $9 \times 10^5$ ohms. This indicated that ten minutes was too short a time with this particular test piece to obtain advanced B-staging.

I claim:

1. A laminated article comprising a core, at least one copper foil covering a face on the core, and a facing layer interposed between the copper foil and the core, the core being formed from a plurality of stacked mica paper sheets, each sheet being composed of overlapping synthetic mica platelets, and being impregnated with an organic resin, and the facing layer being composed of a synthetic mica paper impregnated with a resin cured to a degree greater than that resulting from the B-staging time-temperature schedule for the resin, but short of a full cure resin, and containing at least 50% chopped glass fiber.

2. An article in accordance with claim 1 wherein the resin in the facing layer is cured to a degree greater than that resulting from the normal B-staging time-temperature schedule for the resin, but short of a full cure.

3. An article in accordance with claim 1 wherein the impregnating resin is an epoxy.

4. An article in accordance with claim 1 wherein the solids content in the impregnating resin is essentially composed of 50–70% bismaleimide-triazine and 30–50% brominated epoxy resins, the bromine content being at least 12%.

5. An article in accordance with claim 1 wherein the copper foil has an inside surface coated with a resin layer that is cured to a degree greater than that resulting from the normal B-staging time-temperature schedule for the resin, but short of a full cure.

6. An article in accordance with claim 1 wherein the facing is adhered to the core with a bonding sheet of resin cured to a degree greater than that resulting from the normal B-staging time-temperature schedule for the resin, and having a copper peel strength of at least 7 lb./in. and insulation resistance of at least $10^8$ ohms.

7. A laminated substrate for an electronic component comprising a core member, a copper foil attached to a face on the core and a facing intermediate the copper foil and the core, the core member being formed from a plurality of mica paper sheets, each sheet being composed of overlapping synthetic mica platelets, and being impregnated with an organic resin, and the facing being composed of synthetic mica, resin and chopped glass fibers, the resin in the facing being cured to a degree greater than that resulting from the normal B-staging time temperature schedule for the resin, but short of a full cure, and the assembly being consolidated into a unitary body.

8. A laminated substrate according to claim 7, composed of sheets of mica paper impregnated with an organic resin, the paper being formed from synthetic mica platelets and characterized by the resin being 50-70% of bismaleimide-triazine and 30-50% brominated epoxy resins providing at least 12% bromine, the article having a glass transition temperature of at least 200, a dielectric constant not over 4.0 and a Z-expansion not over 50 ppm/°C.

9. A laminated substrate in accordance with claim 7 wherein the copper foil has an inside surface coated with a thin resin being cured to a degree greater than that resulting from the normal B-staging time-temperature scheduled for the resin, but short of a full cure.

10. A laminated substrate in accordance with claim 8 wherein the facing is adhered to the core face by a bonding layer comprising a sheet of synthetic mica paper impregnated with resin and the resin being cured to a degree greater than that resulting from the normal B-staging time temperature schedule for the resin, but short of a full cure but still capable of flow under heat and pressure.

11. A laminated article comprising a core and at least one copper foil covering a face on the core, the core being formed from a plurality of mica paper sheets, each sheet being composed of overlapping synthetic mica platelets, and being impregnated with an organic resin, and the copper foil having its inside surface coated with a thin resin being cured to a degree greater than that resulting from the normal B-staging time-temperature scheduled for the resin, but short of a full cure.

12. An article in accordance with claim 11 wherein the resin coating on the copper foil is advanced to a degree beyond normal B-staging for the resin, but short of a full cure.

13. An article in accordance with claim 11 wherein the impregnating resin is an epoxy.

14. An article in accordance with claim 11 wherein the impregnating resin is a mixed resin composed of 50-70% bismaleimide-triazine and 30-50% brominated epoxy resins, the bromine content being at least 12%.

15. An article in accordance with claim 12 wherein the resin coating is sufficiently advanced to provide an insulation resistance of at least $10^8$ ohms in the laminated article.

* * * * *